United States Patent
Englhardt et al.

(10) Patent No.: US 9,177,842 B2
(45) Date of Patent: Nov. 3, 2015

(54) DEGASSING APPARATUS ADAPTED TO PROCESS SUBSTRATES IN MULTIPLE TIERS WITH SECOND ACTUATOR

(75) Inventors: Eric A. Englhardt, Palo Alto, CA (US); Richard Giljum, Brentwood, CA (US); Jeffrey C. Hudgens, San Francisco, CA (US); Igor G. Kogan, San Francisco, CA (US); Michael Robert Rice, Pleasanton, CA (US); Sushant S. Koshti, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 666 days.

(21) Appl. No.: 13/571,080

(22) Filed: Aug. 9, 2012

(65) Prior Publication Data
US 2013/0039734 A1    Feb. 14, 2013

Related U.S. Application Data

(60) Provisional application No. 61/521,824, filed on Aug. 10, 2011.

(51) Int. Cl.
*H01L 21/67* (2006.01)
*H01L 21/677* (2006.01)
*H01L 21/687* (2006.01)

(52) U.S. Cl.
CPC ...... *H01L 21/67184* (2013.01); *H01L 21/6719* (2013.01); *H01L 21/67109* (2013.01); *H01L 21/67115* (2013.01); *H01L 21/67167* (2013.01); *H01L 21/67178* (2013.01); *H01L 21/67196* (2013.01); *H01L 21/67201* (2013.01); *H01L 21/67742* (2013.01); *H01L 21/67745* (2013.01); *H01L 21/68742* (2013.01)

(58) Field of Classification Search
CPC .................... H01L 21/67109; H01L 21/67115
See application file for complete search history.

(56) References Cited

U.S. PATENT DOCUMENTS

| | | | |
|---|---|---|---|
| 6,176,667 B1 | 1/2001 | Fairbairn et al. | |
| 6,529,686 B2* | 3/2003 | Ramanan .......... | H01L 21/67109 118/724 |
| 6,582,175 B2 | 6/2003 | Cox et al. | |
| 6,705,394 B1* | 3/2004 | Moslehi ............ | H01L 21/67109 118/724 |
| 6,929,774 B2 | 8/2005 | Morad et al. | |

(Continued)

FOREIGN PATENT DOCUMENTS

| | | |
|---|---|---|
| JP | 2001-160578 | 6/2001 |
| JP | 2003-013215 | 1/2003 |
| JP | 2003-0136215 A * | 1/2003 |

OTHER PUBLICATIONS

International Search Report and Written Opinion of International Patent Application No. PCT/US12/050196 mailed Jan. 29, 2013.

*Primary Examiner* — Gerald McClain
(74) *Attorney, Agent, or Firm* — Dugan & Dugan, PC

(57) ABSTRACT

Substrate transport systems, apparatus, and methods are described. In one aspect, the systems are disclosed having vertically stacked transfer chamber bodies. In one embodiment, a common robot apparatus services process chambers or load lock chambers coupled to upper and lower transfer chamber bodies. In another embodiment, separate robot apparatus service the process chambers and/or load lock chambers coupled to upper and lower transfer chamber bodies, and an elevator apparatus transfers the substrates between the various elevations. Degassing apparatus are described, as are numerous other aspects.

5 Claims, 15 Drawing Sheets

(56) References Cited

U.S. PATENT DOCUMENTS

| | | | | |
|---|---|---|---|---|
| 7,274,005 B2 * | 9/2007 | Quach | ............... | H01L 21/67184 118/724 |
| 7,282,675 B2 * | 10/2007 | Quach | ............... | H01L 21/67109 219/444.1 |
| 7,288,746 B2 * | 10/2007 | Quach | ............... | H01L 21/67109 118/724 |
| 7,297,906 B2 * | 11/2007 | Quach | ............... | H01L 21/67109 118/724 |
| 7,720,655 B2 | 5/2010 | Rice | | |
| 8,029,225 B2 | 10/2011 | van der Meulen | | |
| 2004/0169032 A1 * | 9/2004 | Murayama | ........ | H01L 21/67115 219/411 |

* cited by examiner

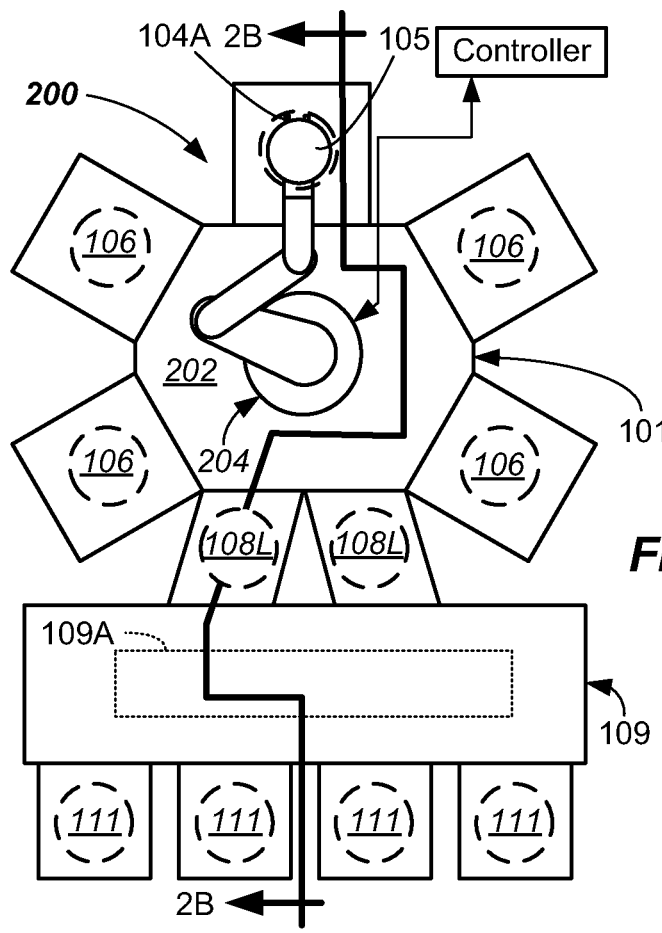
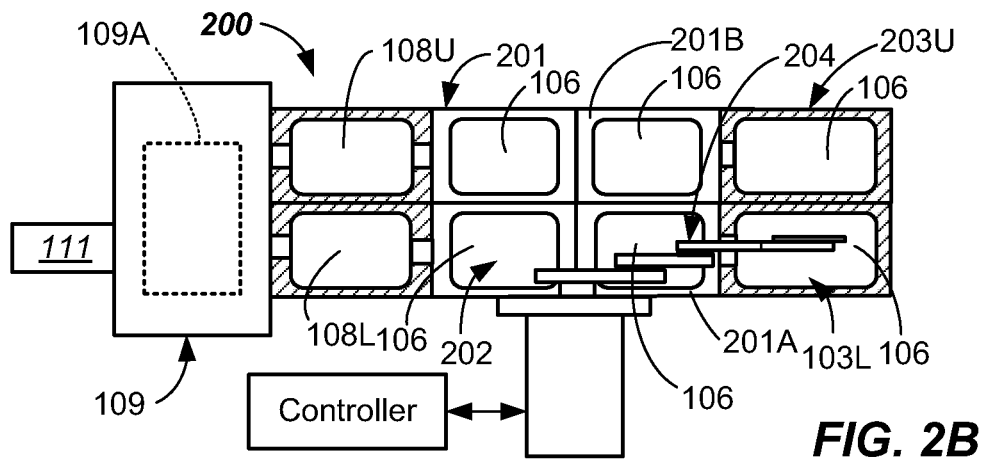

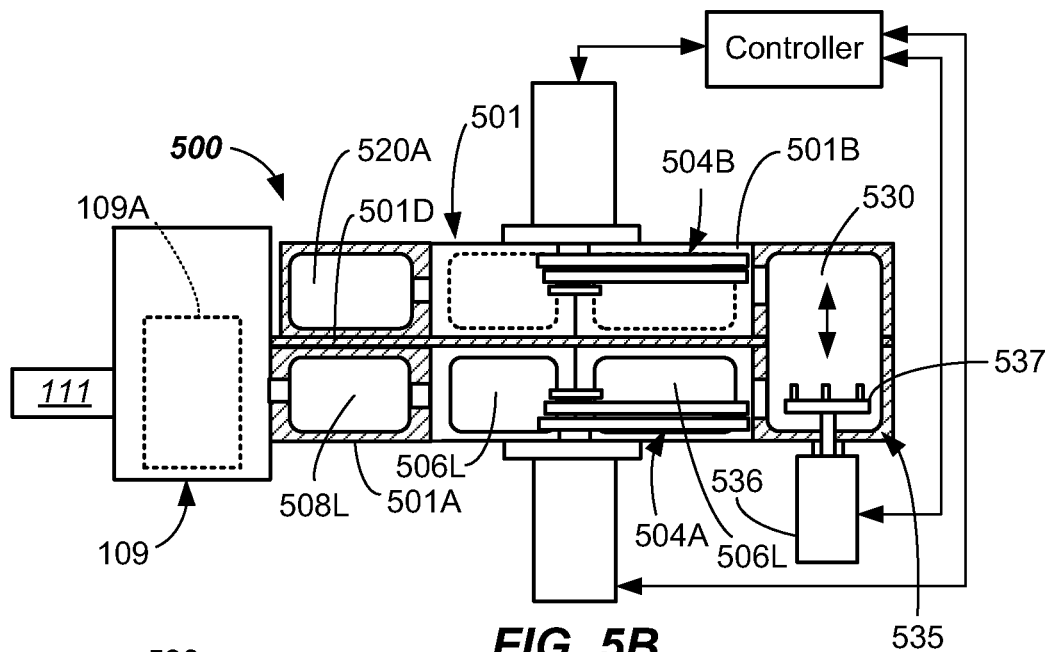
FIG. 5B
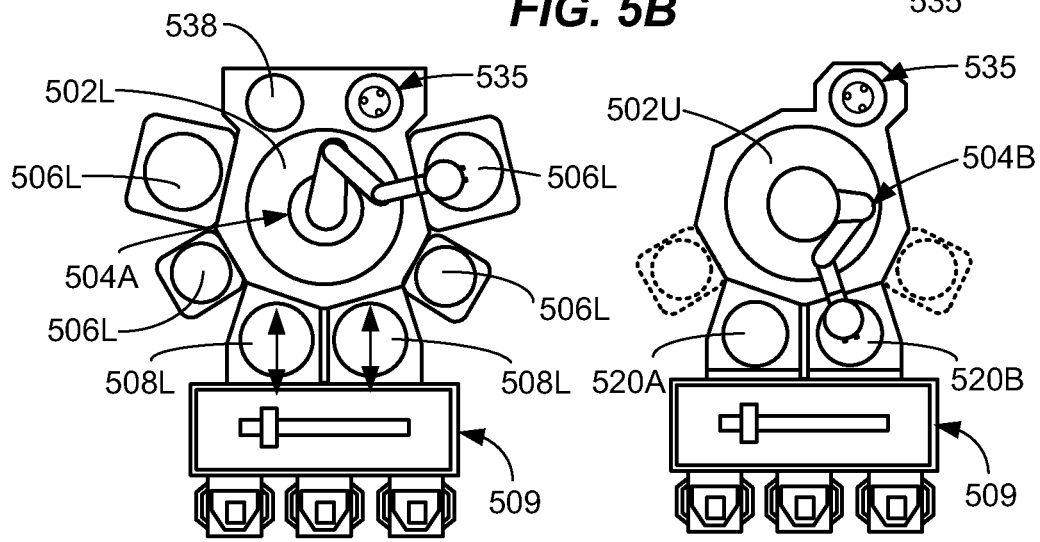
FIG. 5C        FIG. 5D

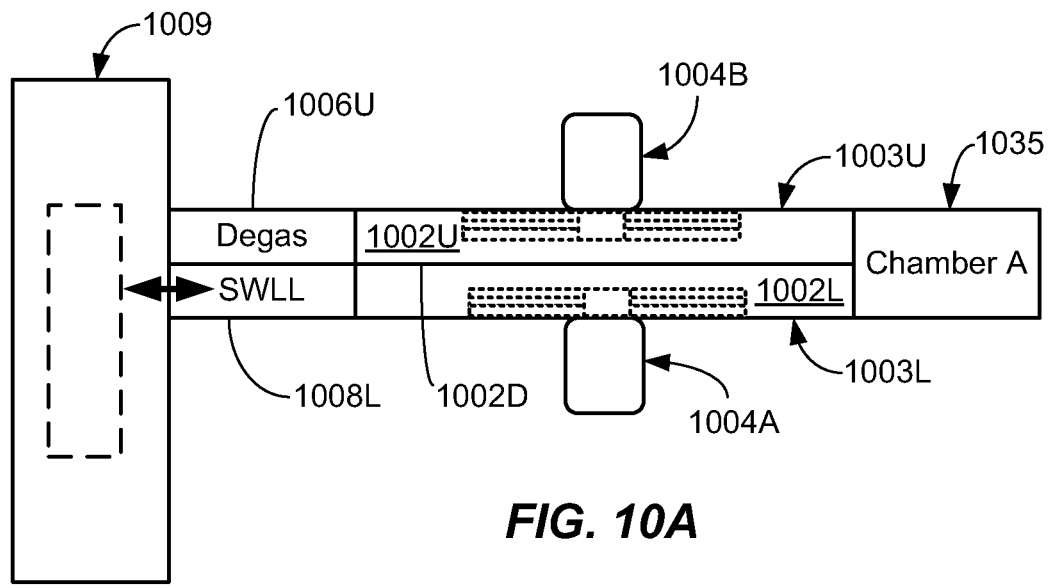
FIG. 10A
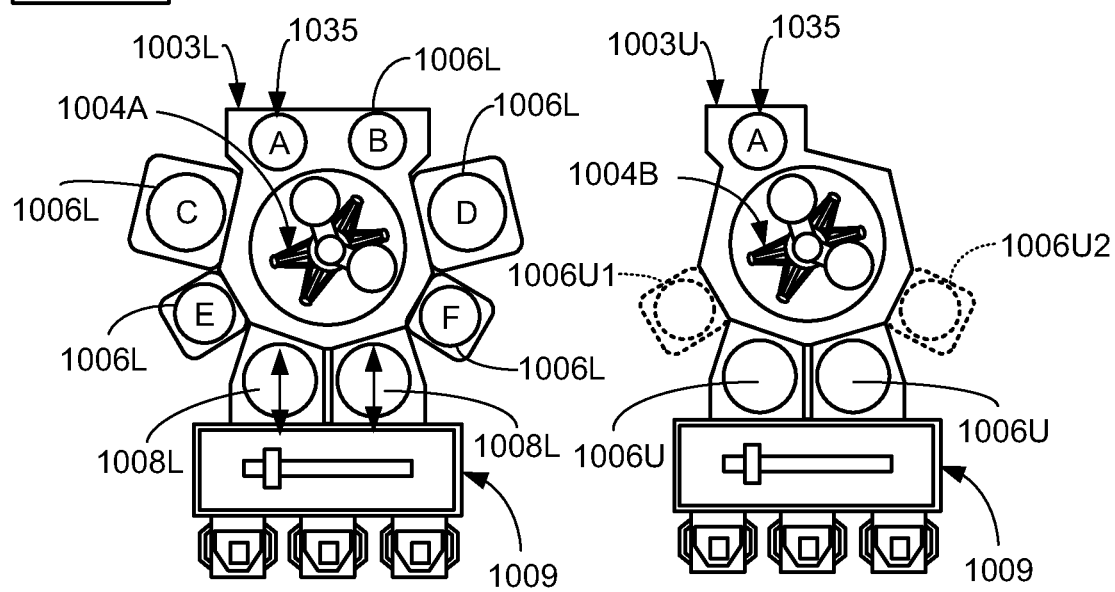
FIG. 10B          FIG. 10C

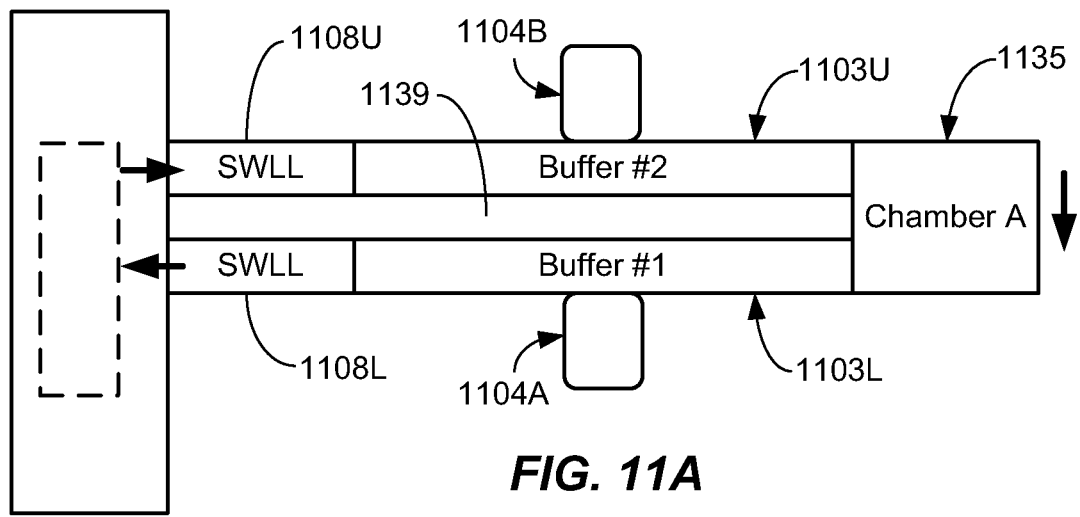
FIG. 11A
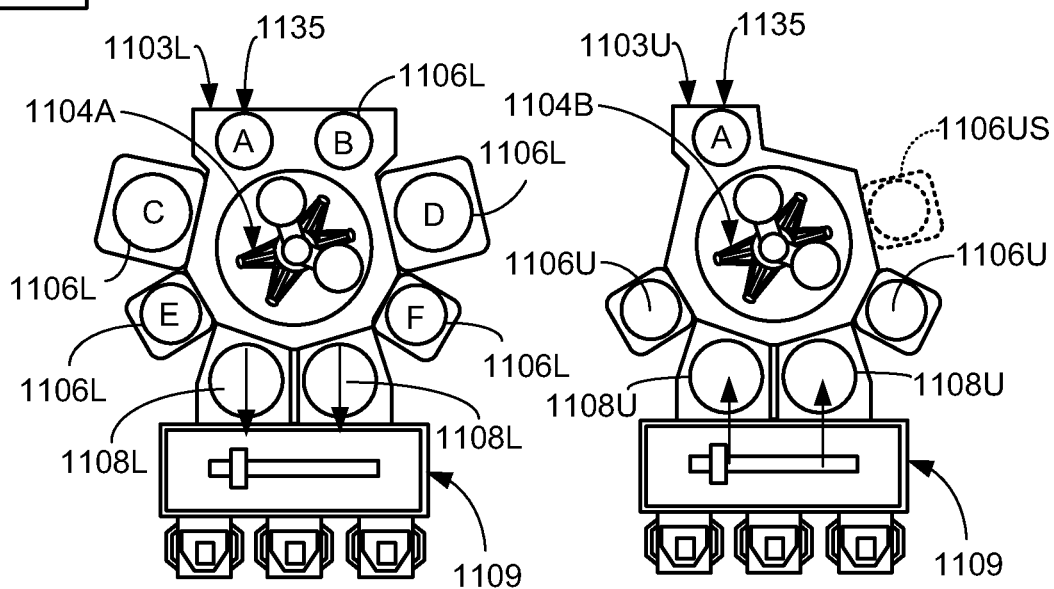
FIG. 11B  FIG. 11C

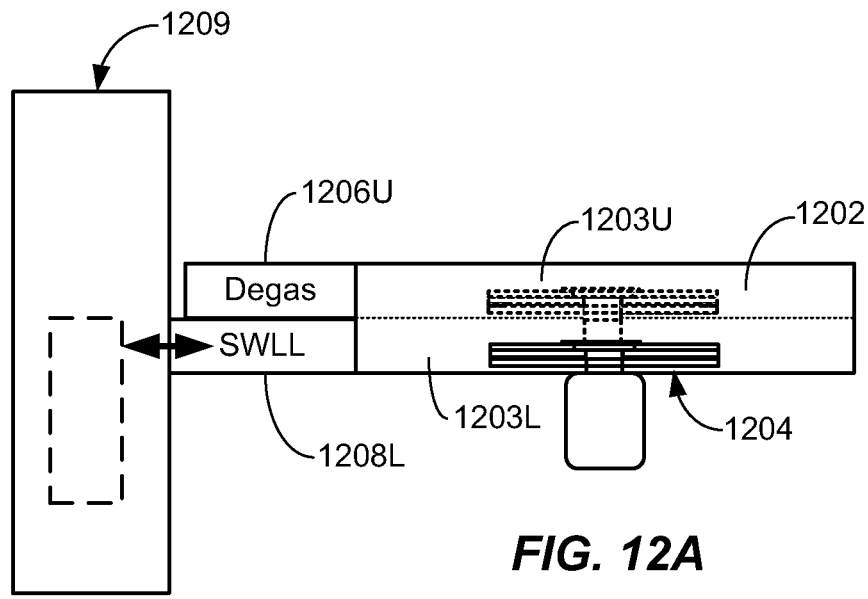
*FIG. 12A*
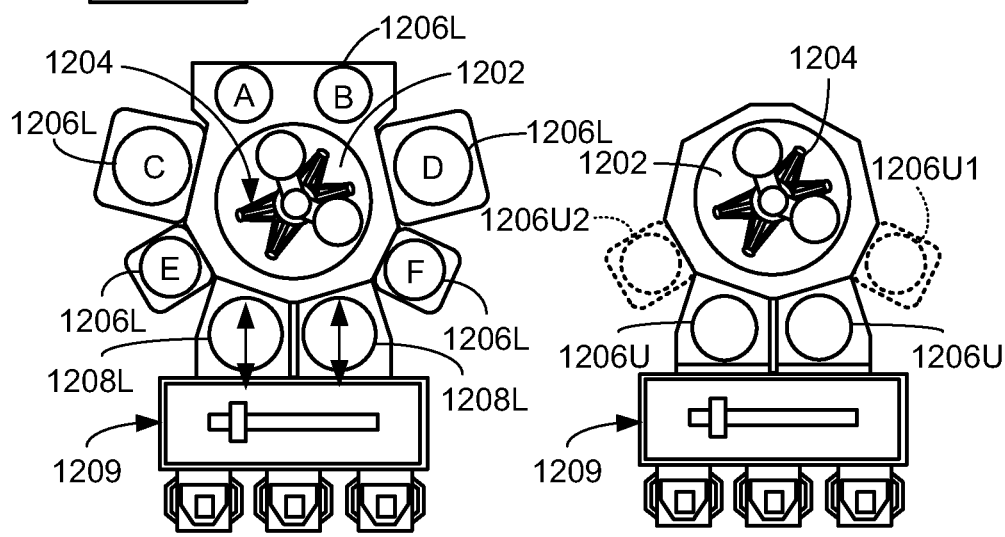
*FIG. 12B*   *FIG. 12C*

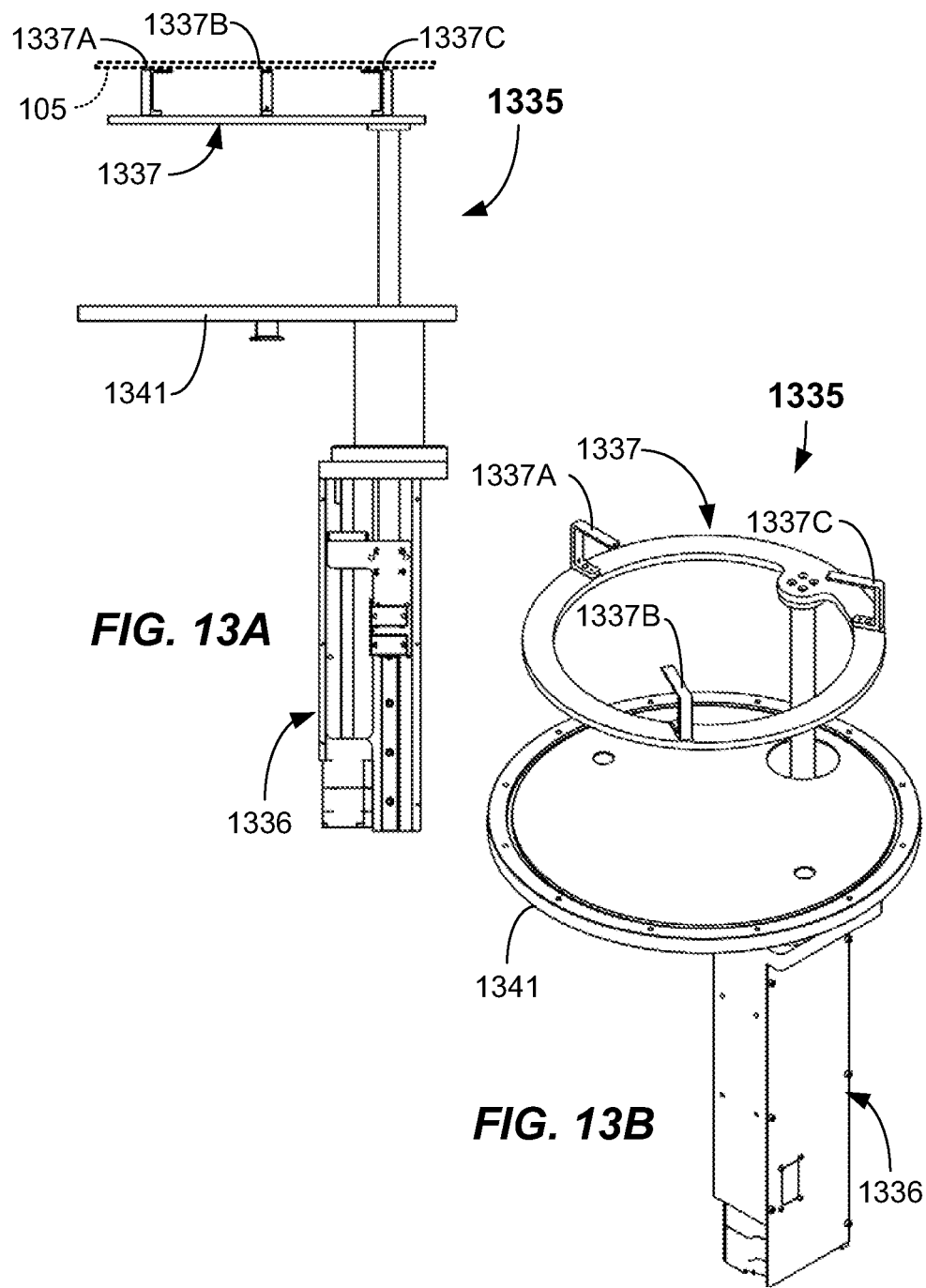

though a substrate may not be clearly illustrated in every drawing, it should be understood that the various embodiments of the systems, apparatus, and methods described herein may be used to transfer substrates.

DEGASSING APPARATUS ADAPTED TO PROCESS SUBSTRATES IN MULTIPLE TIERS WITH SECOND ACTUATOR

RELATED APPLICATIONS

The present application claims priority from U.S. Provisional Patent Application Ser. No. 61/521,824, filed Aug. 10, 2011, entitled "ROBOT SYSTEMS, APPARATUS, AND METHODS ADAPTED TO PROCESS SUBSTRATES IN MULTIPLE TIERS" which is hereby incorporated herein by reference in its entirety for all purposes.

FIELD

The present invention relates to electronic device manufacturing, and more specifically to systems, apparatus, and methods adapted to transport substrates.

BACKGROUND

Conventional electronic device manufacturing systems may include multiple process chambers and load lock chambers. Each of the chambers and load lock chambers are aligned within one plane. Such chambers may be included in cluster tools where a plurality of process chambers may be disbursed about a transfer chamber, for example. These systems and tools may employ transfer robots that may be housed within the transfer chamber to transport substrates between the various process chambers and load lock chambers. For example, the transfer robot may transport a substrate from process chamber to process chamber, from load lock chamber to process chamber, and/or from process chamber to load lock chamber within a tool. Efficient and precise transport of substrates between the various system chambers may improve system throughput, thereby lowering overall operating costs. Furthermore, reduced system size is sought after because distances that the substrates may need to move are reduced. However, if additional process steps are to be added, such additional processing may be accomplished by adding additional process chambers, sometimes as a retrofit. One known way to add on process chambers is to add an additional transfer chamber and transfer robot by using a pass-through chamber. However, the addition of an extra conventional transfer chamber may require additional floor space that may not be readily available.

Accordingly, improved systems, apparatus, and methods for efficient and precise movement of substrates and which allow the addition of more process chambers are desired.

SUMMARY

In one aspect an electronic device processing system is provided. The system includes a transfer chamber, a first group of process chambers arranged at a first lower elevation, a second group of process chambers arranged at a second upper elevation above the first elevation, and a robot apparatus received in the transfer chamber and adapted to transport substrates to both the a first group of process chambers and the second group of process chambers.

In another system aspect an electronic device processing system is provided. The system includes a first lower transfer chamber body adapted to have at least one process chamber or load lock chamber coupled thereto at a first elevation, a second upper transfer chamber body coupled to the first lower transfer chamber body, the second upper transfer chamber body adapted to have at least one process chamber or load lock chamber coupled thereto at a second elevation above the first elevation, and a robot apparatus received in the transfer chamber and adapted to transport substrates between the first elevation and the second elevation.

In yet another system aspect an electronic device processing system is provided. The system includes a first lower transfer chamber body adapted to have at least one process chamber or load lock chamber coupled thereto at a first elevation, a second upper transfer chamber body coupled to the first lower transfer chamber body, the second upper transfer chamber body adapted to have at least one process chamber or load lock chamber coupled thereto at a second elevation above the first elevation, and an elevator apparatus adapted to transport substrates between the first elevation and the second elevation.

In another aspect, a degassing apparatus adapted to degas substrates within an electronic device processing system is provided. The degassing apparatus includes a housing including at least one entrance, a heated platform adapted to heat a substrate within the housing, and a cooling platform adapted to cool a substrate within the housing.

In another aspect, a method of transporting a substrate within an electronic device processing system is provided. The method includes providing a transfer chamber having a first plurality of facets adapted to couple to one or more process chambers arranged around the transfer chamber, and a second plurality of facets adapted to couple to one or more process chambers arranged around the transfer chamber wherein the first and second plurality of facets are vertically stacked, and servicing the first and second plurality of facets with a common robot.

In another method aspect, a method of transporting a substrate within an electronic device processing system is provided. The method includes providing a transfer chamber having one or more first facets adapted to couple to one or more process chambers or load lock chambers at a first elevation, and one or more second facets adapted to couple to one or more process chambers or load lock chambers at a second elevation above the first elevation, and transferring substrates between the first and second elevations.

Numerous other features are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIG. 2A illustrates a schematic top view of an alternative substrate processing system adapted to transport substrates between multi-tiered process chambers and/or load locks according to embodiments.

FIG. 2B illustrates a cross-sectioned side view of the substrate processing system of FIG. 2A taken along section line 2B-2B.

FIG. 5B illustrates a cross-sectioned side view of an embodiment of a processing system shown with multiple robot apparatus adapted to service two tiers at a first and second elevation according to embodiments.

FIG. 5C illustrates a cross-sectioned top view of a first lower elevation of an embodiment of a processing system with multiple tiers according to embodiments.

FIG. 5D illustrates a cross-sectioned top view of a second upper elevation of an embodiment of a processing system with multiple tiers according to embodiments.

FIG. 10A illustrates a side view diagram depicting an electronic device processing system adapted to transport one or more substrates according to embodiments.

FIG. 10B illustrates a cross-sectioned top view depicting a first lower elevation of an electronic device processing system according to embodiments.

FIG. 10C illustrates a cross-sectioned top view depicting a second upper elevation of an electronic device processing system according to embodiments.

FIG. 11A illustrates a side view diagram depicting an alternative electronic device processing system according to embodiments.

FIG. 11B illustrates a cross-sectioned top view depicting a first lower elevation of an electronic device processing system according to embodiments.

FIG. 11C illustrates a cross-sectioned top view depicting a second upper elevation of an electronic device processing system according to embodiments.

FIG. 12A illustrates a side view diagram depicting an alternative electronic device processing system according to embodiments.

FIG. 12B illustrates a cross-sectioned top view depicting a first lower elevation of an electronic device processing system according to embodiments.

FIG. 12C illustrates a cross-sectioned top view depicting a second upper elevation of an electronic device processing system according to embodiments.

FIG. 13A illustrates a side view depicting an elevator apparatus according to embodiments.

FIG. 13B illustrates an isometric view depicting an elevator apparatus according to embodiments.

DETAILED DESCRIPTION

Figure 1A:
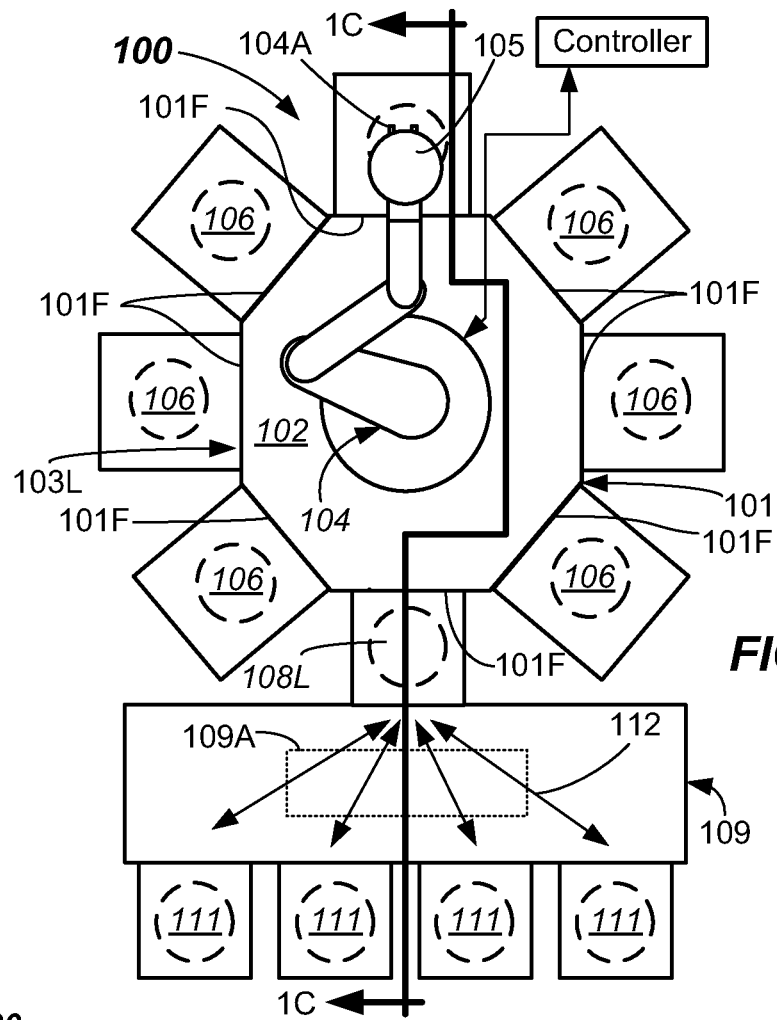
FIG. 1A illustrates a schematic top view of a substrate processing system including a robot apparatus located in a transfer chamber of a main frame and adapted to transport substrates between multi-tiered process chambers and/or load locks according to embodiments.
Figure 1B:
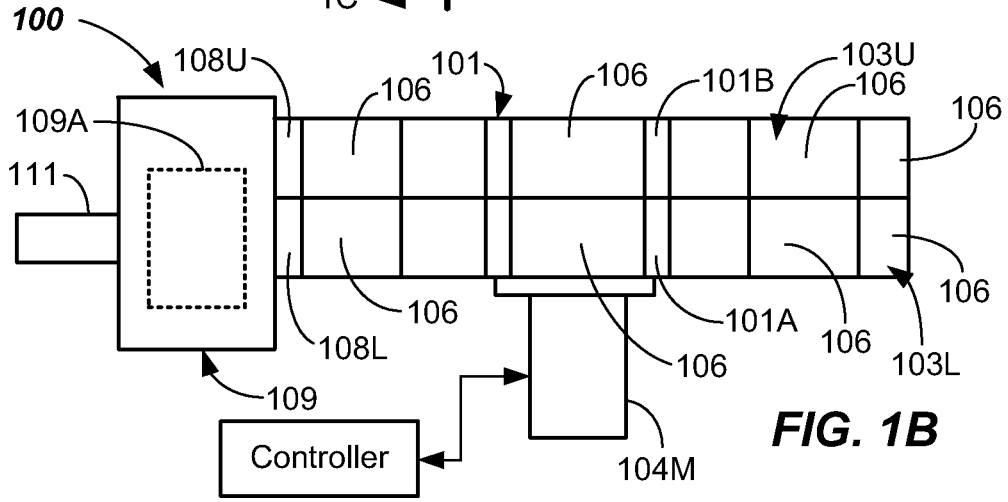
FIG. 1B illustrates a side view of a substrate processing system including multi-tiered process chambers and/or load locks according to embodiments.

Electronic device manufacturing may require very precise and rapid transport of substrates between various locations. In particular, one or more end effectors may be attached at an end of an arm of a robot apparatus and may be adapted to transport substrates resting upon the end effector to and from process chambers and/or load lock chambers of a substrate processing system. In some systems, it is desirable to add additional processes (e.g., process steps) to the tool. Adding an additional process step drives the need to add an additional process chamber to the mainframe. For example, a typical tool may have the following process chambers: Load lock, degas, pre-clean, pass-through/cooldown, barrier PVD, and copper seed PVD. When a pass-through chamber is used, this may result in a flow that may have a higher number (e.g., six) process chambers. Typically, some tools (e.g., Endura manufactured by Applied Materials) may be configured to enable two parallel flows on each tool for a total of 12 process positions, all at the same level.

In some systems, it is desirable to add another process step and process chamber to the tool. However, it is desired to do so without eliminating the ability to run two parallel flows within the tool. Embodiments of the invention enable the addition of an extra process step while maintaining throughput advantages of a dual process.

Accordingly, in one aspect, it is desired to provide a system and method, which may be provided as an upgrade of an existing tool, which allows the addition of one or more additional process chambers while retaining parallel flow and similar system level throughput.

Typical prior art approaches add one or more facets or process chamber positions by redesigning the entire configuration of the mainframe to add an additional facet and process chamber. Optionally, additional process steps may be added by coupling an additional vacuum transfer chamber and robot to the existing tool at an adjacent lateral location by use of a pass-through chamber as is shown in U.S. Pat. No. 7,720,655 to Rice entitled "Extended Mainframe Designs For Semiconductor Device Manufacturing Equipment." However, the first approach is not retrofittable to an existing installed system, as it involves a complete redesign to add an additional process chamber. The second approach may add significant floor area or footprint to the tool, which may not be available.

Accordingly, in one aspect of embodiments of the present invention, additional facets and/or one or more additional process chambers or load lock chambers are added by incorporating another tier (e.g., a second tier) that is located at an elevation above the first tier. The first and second tiers may be serviceable by one or more robots in a transfer chamber. In some embodiments, multiple arrangements of facets, being adapted to accept process chambers and/or load lock chambers, may be configured and arranged, one above another, in any number of configurations. In some embodiments, the additional process chambers or load lock chambers may be provided by attaching (e.g., bolting) an additional (upper) transfer chamber body on top of an existing (lower) transfer chamber body. Thus, an upper elevation of facets formed in an upper transfer chamber body may be coupled to a lower elevation of facets formed on a lower chamber body. Process chambers and/or load lock chambers may be attached to the respective facets of the upper and lower facets. Additionally, slit valves may be added at one or more of the facet positions provided at the second elevation.

In some embodiments, a transfer robot apparatus may be provided that includes sufficient mobility along a Z axis in order to service process chambers and/or load lock chambers on both a first lower elevation and second upper elevation of the two tiers.

In another aspect, an electronic device processing system is provided that includes a first tier at a first lower elevation and a second tier at a second upper elevation different than the first lower elevation, and an elevator apparatus adapted to transfer substrates (e.g., silicon wafers) between the first and second elevations. Separate robots may be used to service the one or more process chambers and/or one or more load lock chambers at each of the lower and upper elevations. The elevator apparatus may exchange substrates with the robots operating and servicing the two tiers.

In yet another aspect, a dual-mode degas (DMD) apparatus is provided. The DMD apparatus may be integrated into a load lock chamber in some embodiments, or it may be a stand-alone process chamber. In the integrated configuration, the DMD includes a first portion adapted to be attached to a factory interface and a second portion adapted to be attached to walls of a transfer chamber. The degassing apparatus includes a housing including at least one entrance, a heated platform adapted to heat a substrate within the housing, and a cooling platform adapted to cool a substrate within the housing. Accordingly, both heating and cooling of the substrate may be accomplished in the DMD apparatus.

Further details of example embodiments of various aspects of the invention are described with reference to FIGS. 1A-11C herein.

FIGS. 1A-1D illustrate various top and side view schematic diagrams of an example embodiment of an electronic device processing system 100 according to one or more embodiments of the present invention. The electronic device processing system 100 may be adapted to process substrates (e.g., silicon-containing wafers, plates, or the like) by imparting one or more processes thereto, such as degassing, cleaning, deposition such as chemical vapor deposition (CVD), physical vapor deposition (PVD), plasma enhanced chemical vapor deposition (PCVD), coating, oxidation, nitration, etching, polishing, lithography, storage, or the like. The electronic device processing system 100 includes a housing 101 including a first lower transfer chamber body 101A, and a second upper transfer chamber body 101B including a common transfer chamber 102 formed by the interaction of chamber portions formed in each body 101A, 101B. The transfer chamber 102 includes top, bottom, and side walls and may be maintained at a vacuum, for example. As shown in FIG. 1A, which is a cross-sectional top view through the first lower transfer chamber body 101A just above the robot 104, the first lower transfer chamber body 101A has a plurality of first facets 101F adapted to couple to one or more process chambers 106 and/or load locks 108L arranged around the transfer chamber 102 at the lower elevation 103L. Likewise, the second upper transfer chamber body 101B has one or more second facets adapted to couple to one or more process chambers 106 and/or load lock chambers 108U at the second (upper) elevation 103U above the first elevation 103L. The cross sectioned view above the robot 104 and through the second upper transfer chamber body 101B is identical to that shown in FIG. 1A. As can be seen, there may be load lock chambers 108L, 108U located at each elevation 103L, 103U. Only one load lock chamber 108L, 108U is shown at each elevation. However, in some embodiments, more than one load lock chamber may be provided at one or more of the elevations 103L, 103U.

In the depicted embodiment, a robot apparatus 104 is received in the transfer chamber 102 and is adapted to be operable therein to service a first lower elevation 103L at the first lower transfer chamber body 101A, and a second upper elevation 103U at a second upper transfer chamber body 101B. "Service," as used herein means moving a substrate into and/or out of a chamber (e.g., a process chamber or load lock chamber). The first lower elevation 103L is positioned below the second upper elevation 103U. The robot apparatus 104 may have a drive motor 104M and multiple arms or links and may be of any suitable construction. For example, the robot 104 may be a SCARA robot, a scissors robot, or the like. The robot apparatus 104 may comprise a one-bladed, two-bladed or multi-bladed robot.

The robot apparatus 104 may be adapted to pick or place substrates 105 (sometimes referred to as a "wafer" or "semiconductor wafer") mounted on an end effector 104A (sometimes referred to as a "blade") of the robot apparatus 104 to or from a destination. In the depicted embodiment, the transfer may be between one or more process chambers 106 arranged about and coupled to the transfer chamber 102 at the upper elevation 103U or lower elevation 103L, or both. In some embodiments, the transfer may be between one or more process chambers 106 and/or one or more load lock chambers 108L, or 108U that may be coupled to the transfer chamber 102 at the multiple elevations 103L, 103U. Any suitable transfer sequence may be used.

In the depicted embodiment, the robot apparatus 104 may be any suitable multi-link robot that has sufficient Z-axis translation capability to transfer a substrate 105 between a process chamber 106 or load lock 108L connected to the first lower transfer chamber body 101A and a process chamber 106 or load lock chamber 108U connected to the second upper transfer chamber body 101B.

The load lock chambers 108L, 108U may be adapted to interface with a factory interface 109 that may receive substrates 105 from substrate carriers 111 such as Front Opening Unified Pods (FOUPs) docked at load ports of the factory interface 109. Another robot 109A (shown dotted) may be used to transfer substrates 105 between the substrate carriers 111 and the load lock chambers 108L, 108U as shown by arrows 112. This robot 109A may also have sufficient Z-axis capability to service both load locks 108L, 108U. Transfers to and from the load locks 108L, 108U may be carried out in any sequence or order. In the depicted embodiment, transfer into or out of the transfer chamber 102 at either or both of the first or second elevations (tiers) may be accomplished.

Figure 1C:
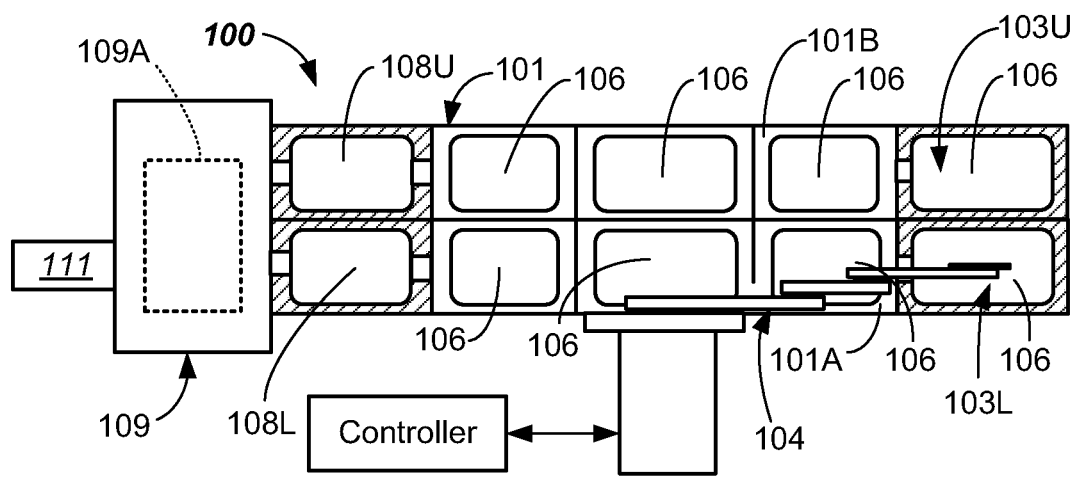
FIG. 1C illustrates a cross-sectioned side view of a substrate processing system including a robot servicing a first elevation of a multi-tiered process chambers and/or load locks taken along section line 1C-1C.
Figure 1D:
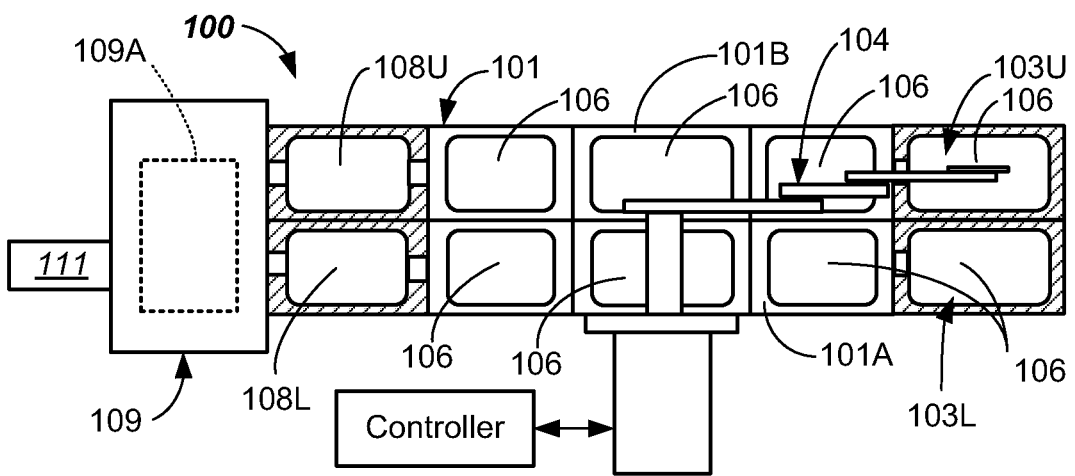
FIG. 1D illustrates a cross-sectioned side view of a substrate processing system including a robot taken along section line 1C-1C, but with the robot raised in a Z axis and servicing a second elevation of a multi-tiered process chambers and/or load locks.

However, it should be understood that substrate transfer may be, in an optional configuration, in through one load lock chamber 108L and out through the other load lock chamber 108U, or visa-versa, for example. The tiers may be arranged in any suitable orientation. For example, in the depicted embodiment, the process chambers 106 are shown vertically on top of one another. However, the process chambers 106 may be offset rotationally so that serviceability is improved, i.e., the process chambers 106 are rotated slightly so that they are not aligned vertically one over top of the other. In some embodiments, the upper elevation 103U (tier) may include less process chambers than the lower elevation 103L. For example, the upper elevation 103U may include only one or more process chambers 106 that undergo a degas processes (e.g., one or more dual mode degas (DMD) processes), whereas the lower elevation may include other different processes such as CVD, PVD, PCVD, etch, or the like. FIGS. 1C and 1D illustrate respective cross-sectional side views with the robot 204 shown servicing a process chamber 106 at the lower elevation 103L (FIG. 2C) and servicing a process chamber 106 at the upper elevation 103U (FIG. 2D).

Now referring in more detail to FIGS. 2A and 2B, another embodiment of an electronic device processing system 200 is described. The electronic device processing system 200 includes a multi-link robot apparatus 204 housed in a transfer chamber 202 thereof. The electronic device processing system 200 includes a transfer chamber body 201 made up of a first lower transfer chamber body 201A configured and adapted to have at least one process chamber or load lock chamber coupled thereto at a first elevation, and a second upper transfer chamber body 201B coupled to the first lower transfer chamber body 201A, such as by bolting. The two bodies 201A, 201B are preferably sealed to one another and cooperate to form the transfer chamber 202. The second upper transfer chamber body 201B is configured and adapted to have at least one process chamber and/or load lock chamber coupled thereto at a second elevation above the first elevation. Each body 201A, 201B is shown including seven facets adapted to accept at least one process chamber and/or load lock chamber thereat. However, it should be understood that more or less facts may be included. Facets not being used may be suitably covered. Optionally, one or more of the facets may be closed by not having any opening (e.g., being solid), i.e., formed integrally with the body as a solid piece of material. At least one process chamber or load lock chamber may be attached to at least some of the facets shown. However, not all facets need to be used, and may be reserved for later process step additions. In the depicted embodiment, five process chambers 106 and two load lock chambers 108L are provided at the lower elevation 103L. Likewise, five process chambers 106 and two load lock chambers 108U are provided at the upper elevation 103U.

As shown, the robot 204 is adapted to service the upper elevation 103U and the lower elevation 103L by having a Z-axis capability sufficient to reach both elevations and transfer substrates there between. In the depicted embodiment, the robot 204 may transfer substrates to and/or from the factory interface 109 through upper and/or lower load locks 108L, 108U in either direction. The robot 204 may service one or more process chambers 106 located at either elevation to transfer substrates to and/or from the process chambers 106 in any order. For example, one or more of the upper process chambers 106 may be used for degas process (e.g., a dual mode degas). In some embodiments, the degas process may be the only process taking place on the second upper elevation 103U. Conventional slit valves (not shown) may be included at each load lock 108L, 108U and process chamber 106.

Figure 3:
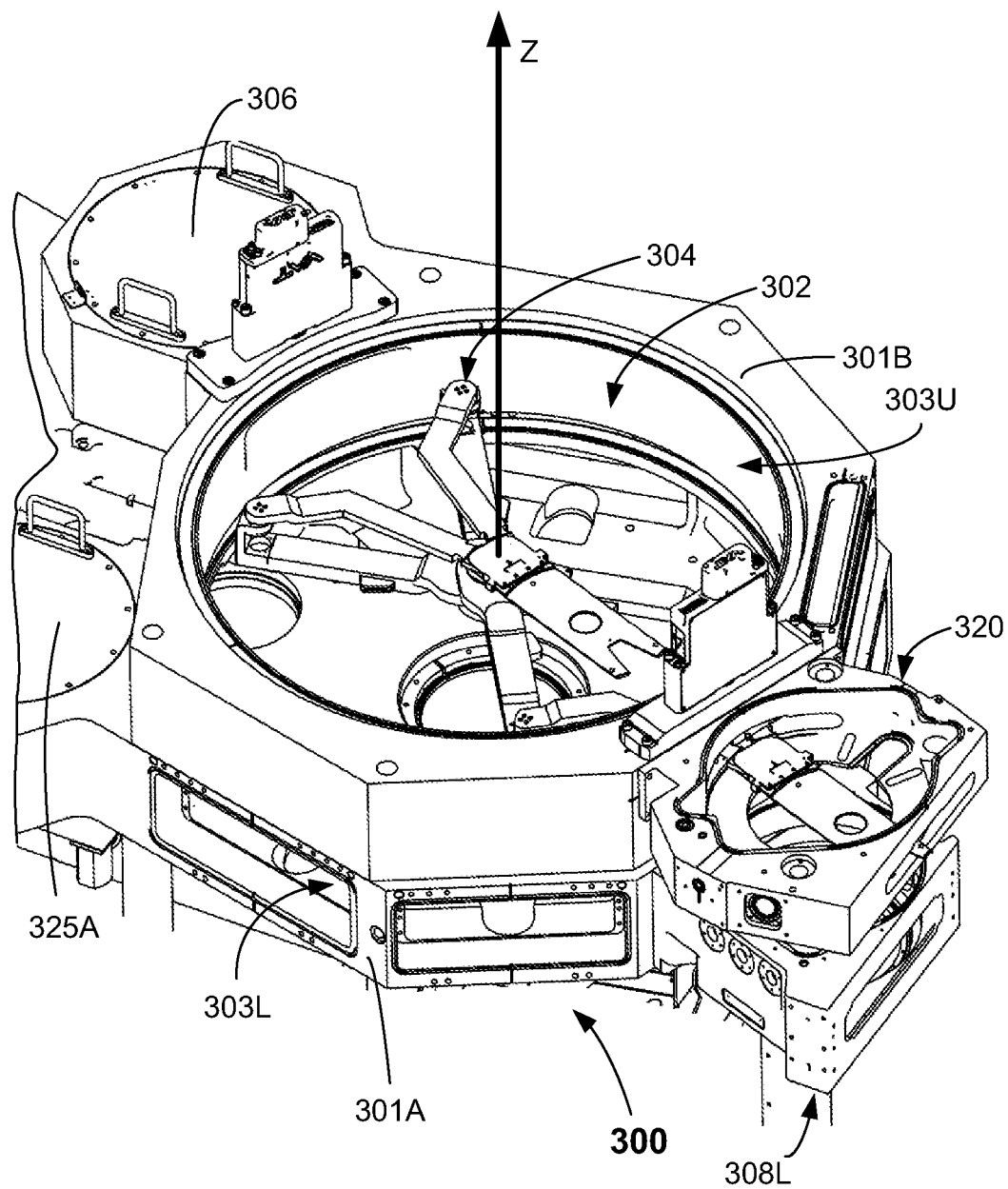
FIG. 3 illustrates an isometric view of an embodiment of the processing system shown with multi-tiered transfer chamber bodies with some process chambers removed for clarity according to embodiments.
Figure 4:
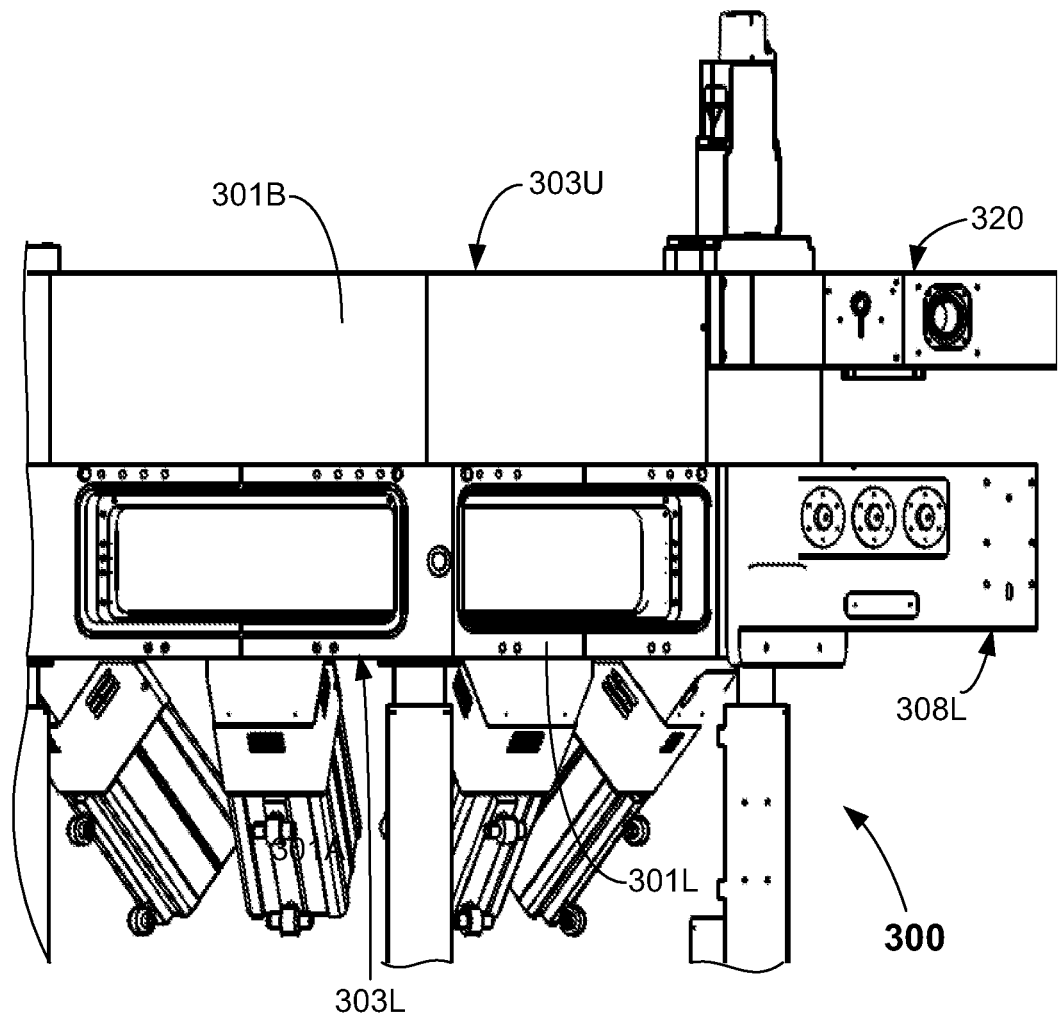
FIG. 4 illustrates a side view of an embodiment illustrating a two-tiered transfer chamber body.

Now referring in more detail to FIGS. 3 and 4, another embodiment of an electronic device processing system 300 is described in more detail. The electronic device processing system 300 includes a multi-link robot apparatus 304 housed in a transfer chamber 302 thereof. The electronic device processing system 300 includes a first lower transfer chamber body 301A configured and adapted to have at least one process chamber or load lock chamber coupled thereto at a first elevation, and a second upper transfer chamber body 301B coupled to the first lower transfer chamber body 301A, such as by bolting. The two bodies 301A, 301B are preferably sealed to one another. The second upper transfer chamber body 301B is configured and adapted to have at least one process chamber and/or load lock chamber coupled thereto at a second elevation above the first elevation. Each body 301A, 301B is shown including eight facets adapted to accept at least one process chamber and/or load lock chamber thereat. However, it should be understood that more or less facets may be included. Facets not being used may be suitably covered or otherwise closed. At least one process chamber or load lock chamber may be attached at each of the bodies 301A, 301B as shown. However, not all facets need to be used, and may be reserved for later process step additions, or not used.

In the depicted embodiment, the robot apparatus 304 is received in the transfer chamber 302 and adapted to transport substrates between the first elevation 303L and the second elevation 303U. The robot apparatus includes Z axis capability to move sufficiently (about 5-20 inches) to move substrates between the two elevations 301L, 301U and service the various process chambers and load locks thereat. The Z-axis capability may be provided by any suitable motor and drive mechanism. For example, the robot apparatus 304 may include a vertical motor and a vertical drive mechanism that is adapted to cause vertical motion (in the Z axis) of the end effector of the robot apparatus 304 so that it may operate between the two elevations, and put and pick substrates at the various process chambers and/or load lock chambers coupled to the two elevations 301L, 301U.

The vertical drive mechanism may include a worm drive, lead screw, or rack and pinion mechanism that when rotated by the vertical motor causes the end effector to translate vertically along the Z axis. A bellows or other suitable vacuum barrier may be used to accommodate the vertical motion and also act as a vacuum barrier between the transfer chamber 302 and areas outside of the transfer chamber 302 that may be at atmospheric pressure. One or more translation-accommodating devices, such as linear bearings or other linear motion restraining means may be used to restrain the motion to vertical motion only along the Z axis. Other conventional robot components may be included to provide rotation and/or translation of the end effector such that various process chambers and/or load lock chambers may be serviced.

The robot apparatus 304 may be any suitable robot having an end effector adapted to hold or support the substrates during the transfer between the elevations. The robot 304 may be single-bladed or dual-bladed robot. The operation of the robot apparatus 304 may be controlled by suitable commands to the drive motors from a controller (not shown).

In the depicted embodiment, a degassing apparatus 320 is shown attached to one of the facets (e.g., an end facet facing a factory interface) on the upper body 301B. Pass-through chamber 325A may be provided in some embodiments. The pass-through chamber 325A is shown integral with the lower transfer chamber body 301A to enable substrates to pass through to another connected transfer chamber (e.g., a transfer chamber like transfer chamber 645—See FIG. 6). Accordingly, in the depicted embodiment, two separate, laterally-aligned transfer chambers may be utilized at the same elevation. However, pass-through chamber 325A and an additional laterally-oriented transfer chamber (e.g., transfer chamber like transfer chamber 645) are optional and may be excluded. Process chambers may be optionally provided at those facet locations when the pass-through chamber 325A is omitted. Other process chambers 306 may be provided on the upper elevation for carrying out any desired process thereat.

A "facet" as used herein is a location on the upper transfer body 301B or lower transfer body 301A adapted to receive and attach a process chamber, load lock chamber, or pass-through chamber. Typically, a facet includes a planar surface that is oriented and configured to receive and couple a process chamber, load lock chamber, or pass-through chamber thereat and includes an opening through which a substrate may be passed. Conventional slit valves (not shown) may be included at each process chamber 306, load lock chamber 308L, or pass-through chamber 325 (if used). As shown, one or more load locks 308L may be provided on the lower elevation.

Figure 5A:
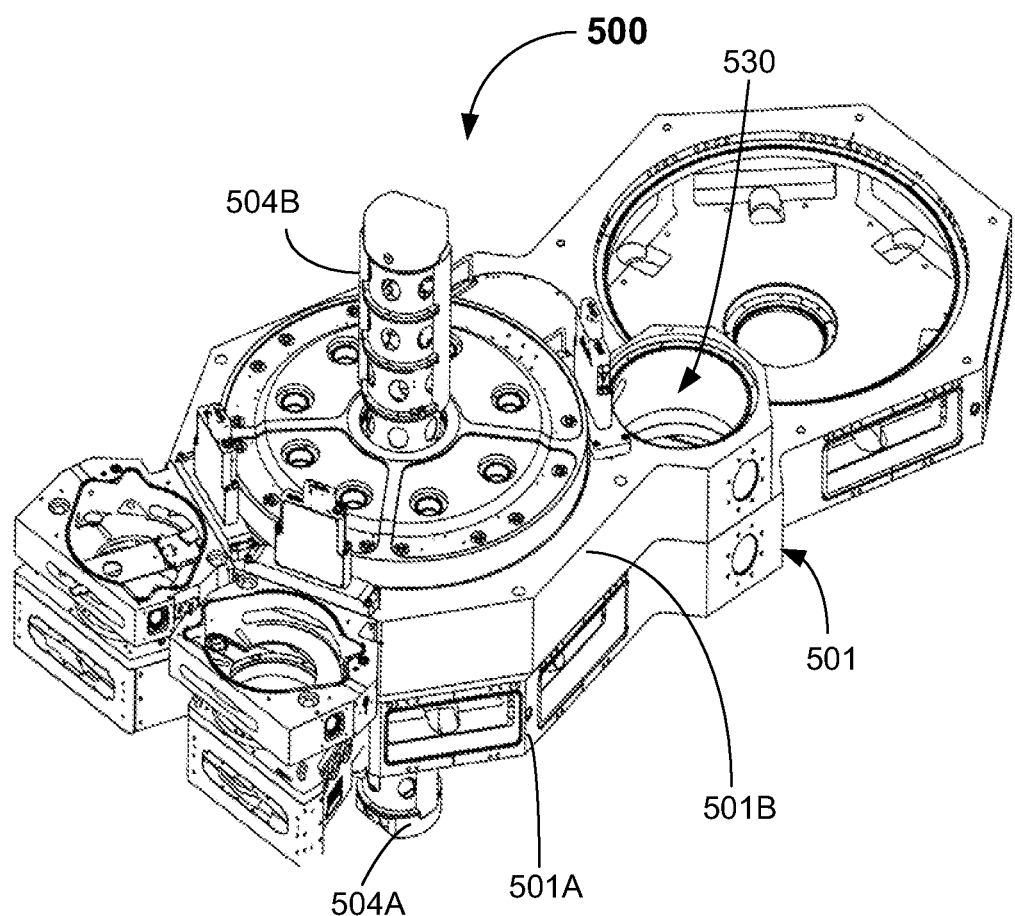
FIG. 5A illustrates an isometric view of an embodiment of a processing system shown with multiple robot apparatus adapted to service two tiers at a first and second elevation, with some of the process chambers removed for clarity according to embodiments.

FIGS. 5A-5D and 6 illustrate various diagrams of an example embodiment of another electronic device processing system 500 according to another embodiment. The electronic device processing system 500 is similar to the previously-described embodiment in that it includes a transfer chamber body 501 having a first lower transfer chamber body 501A adapted to have at least one process chamber 506L or load lock chamber (e.g., 508A, 508B) coupled thereto at a first vertical elevation, and a second upper transfer chamber body 501B coupled to the first lower transfer chamber body 501A, the second upper transfer chamber body 501B being adapted to have at least one process chamber 506U and/or load lock chamber coupled thereto at a second vertical elevation above the first vertical elevation. In this embodiment, the two chamber bodies 501A, 501B are connected to one another, and a divider 501D may be provided separating the upper transfer chamber 502U (FIG. 5D) and lower transfer chamber 502L (FIG. 5C).

In the depicted embodiment, a first robot 504A services the first lower transfer chamber body 501A at a first lower vertical elevation, and a second robot 504B services the a second upper transfer chamber body 501B at a second upper vertical elevation above the lower vertical elevation. Unlike the previous embodiment, where a common robot apparatus 304 was adapted to transfer substrates between the elevations, an elevator apparatus 535 in the instant embodiment is received in an elevator passage 530. The elevator apparatus 535 is adapted to transport substrates between the lower and upper vertical elevations. For example, substrates may be transferred (e.g., one at a time, two at a time, or more at a time) between the first elevation of the lower body 501A and the second elevation of the upper body 501B thus transferring the substrates between the upper transfer chamber 502U and the lower transfer chamber 502L. Robots 504A, 504B pass off and receive substrates from the elevator apparatus 535. The entire system 500 may be mounted on a frame 640.

Figure 6:
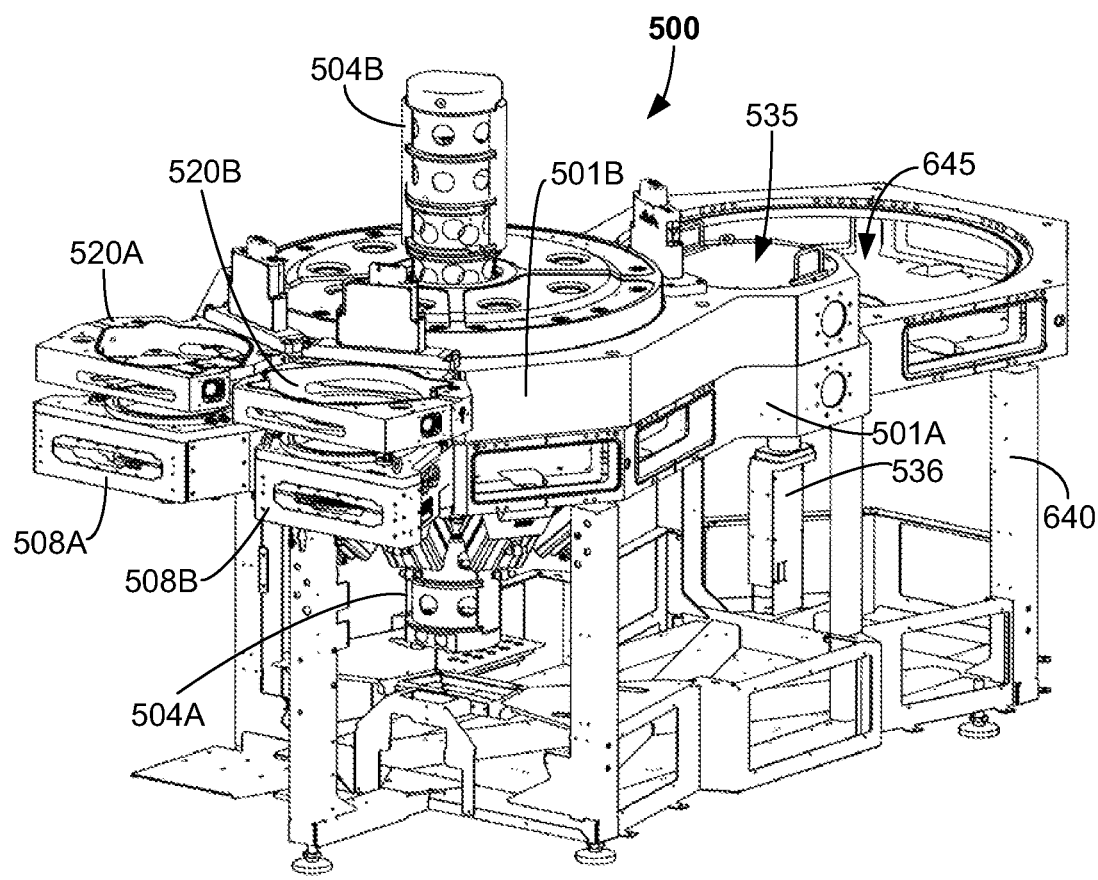
FIG. 6 illustrates an isometric view of an embodiment of a processing system shown with multiple robot apparatus adapted to service two tiers at a first and second elevation and an elevator apparatus adapted to transfer substrates between the first and second tiers according to embodiments.

As shown in FIG. 5B and FIG. 6, the elevator apparatus 535 includes an actuator 536 that is coupled to a carrier 537 having one or more supports, slots, or platforms that are adapted to carry the one or more substrates between the first and second elevations. Actuation of the actuator 536 moves the carrier 537 vertically within the passage 530 between the elevations such that end effectors of the robots 504A, 504B may extract substrates resting on the carrier 537. In one implementation, a pass-through 538 located adjacent to the elevator apparatus 535 at the first lower elevation may function as an exchange location so that substrates may be passed through to an optional second transfer chamber 645 (See FIG. 6).

In the depicted embodiments of FIG. 5A-5D and FIG. 6, several load locks 508L are shown coupled to the first lower transfer chamber body 501A at the first elevation. Load locks 508L are configured and adapted to pass substrates between the transfer chamber formed inside the first lower transfer chamber body 501A and the factory interface 509. Robot 504A services the first elevation and passes substrates to and from the load locks 508L, the process chambers 506 and the elevator apparatus 535. Similarly, several degassing apparatus 520A, 520B may be coupled to the second upper transfer chamber body 501B at the second elevation. The degassing apparatus 520A, 520B may be used to perform a degassing process on the substrates placed thereat by the second robot 504B. In some embodiments, the degassing apparatus 520A, 520B may carry out a dual mode degas process where both heating and cooling of the substrate is carried out. In one implementation, substrates may pass into or out of the upper transfer chamber formed inside the second upper transfer chamber body 501B from the factory interface 509 through one or both of the degassing apparatus 520A, 520B.

Figure 7:
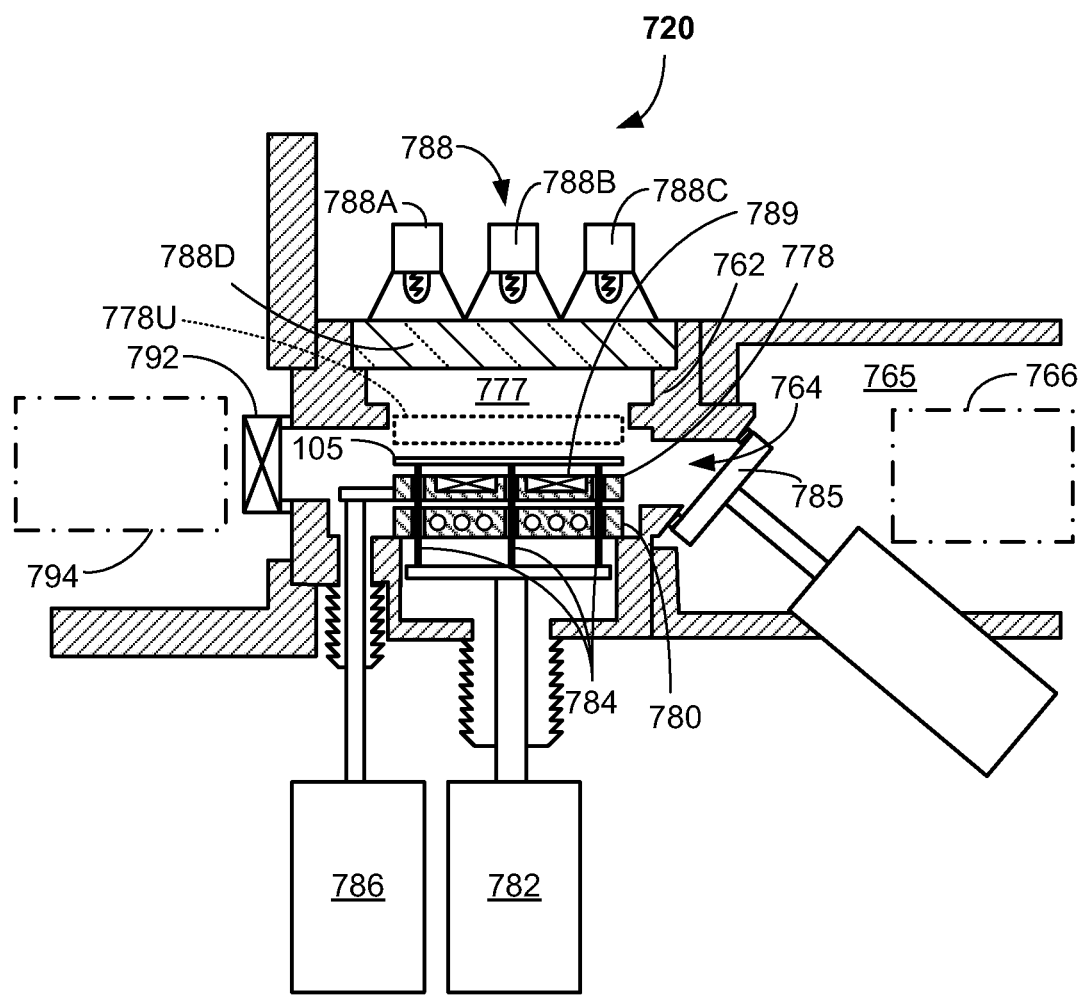
FIG. 7 illustrates a cross-sectioned side view of an embodiment of a dual-mode degas apparatus according to embodiments.

FIG. 7 illustrates an embodiment of a degassing apparatus 720 configured to carry out a degassing process on a substrate 105. In particular, this embodiment includes the ability to both heat and cool a substrate 105. The degassing apparatus 720 includes a housing 762 including at least one entrance 764 that is configured and adapted to receive substrates from a transfer chamber 765 (only a portion shown). A robot apparatus 766 (shown dotted), such as any of the robots described herein may be used to transfer the substrate 105 into the degas chamber 777. However, any suitable multi-arm robot may be used. The degassing apparatus 720 may be used in a single tier system or a dual/multi tier system. The degassing apparatus 720 includes a heated platform 778 configured and adapted to heat a substrate 105 within the housing 762, and a cooling platform 780 configured and adapted to cool a substrate 105 within the housing 762.

A first actuator 782 may be coupled to and actuate pins 784 which are configured and adapted to carry a substrate 105 to a proximity of the cooling platform (e.g., in thermal contact therewith) when the heating platform is positioned at the upper position (shown dotted and labeled 778U). For example, after processing in a process chamber, a slit valve 785 may be opened and a substrate 105 may be placed on the pins 784 by robot 766. Slit valve 785 may be of the construction shown or any suitable conventional construction. The pins 784 may be lowered to rest the substrate 105 on the cooling platform 780 with the heating platform 778 being actuated by a second actuator 786 to the upper location (shown dotted as 778U). The cooling platform 780 may include cooling passages containing cooling fluid so that the substrate 105 may be cooled, such as to a temperature below about 30° C., or even to a temperature below about 20° C.

In a degassing operation, the second actuator 786 is configured and adapted to a carry substrate 105 to the proximity of a supplementary heating source 788. The supplementary heating source 788 may be at least one, and preferably a plurality of high intensity heat lamps 788A, 788B, and 788C. The supplementary heating source 788 may radiate heat through a window 788D, such as a glass window. The second actuator 786 is coupled to the heated platform 778 and is configured and adapted to move the heated platform 778 vertically to the upper position (778U shown dotted) located proximate the supplementary heating source 788. The heated platform 778 may include a heater, such as a resistance heater 789 therein. Together, the heated platform 778 and the supplementary heat source 788 are adapted to generate a temperature of a substrate 105 of greater than about 100° C., or even above 200° C., or even above 300° C. in some embodiments.

In the disclosed embodiment, the resistance heater 789 is provided on the heated platform 778 and the supplementary heat source 788 is provided adjacent to a wall (e.g., an upper wall) of the degas chamber 777. In the depicted embodiment, the degassing apparatus 720 may include at least one slit valve 785, but may include two slit valves in some embodiments, namely slit valve 785 and slit valve 792. Slit valve 792 allows entry and exit of substrates into the chamber 777, such as from a factory interface (e.g., 509). A suitable robot 794 located in the factory interface (e.g., 509) including an end effector may pick and place substrates onto the pins 784 through slit valve 792. However, in some embodiments, the degassing apparatus 720 may contain only one slit valve 785 and the substrates 105 may enter and exit only through this slit valve 785, the other location being closed and sealed. In this later embodiment, the degassing apparatus 720 may be located at the second elevation as shown in FIG. 5D.

Figure 8:
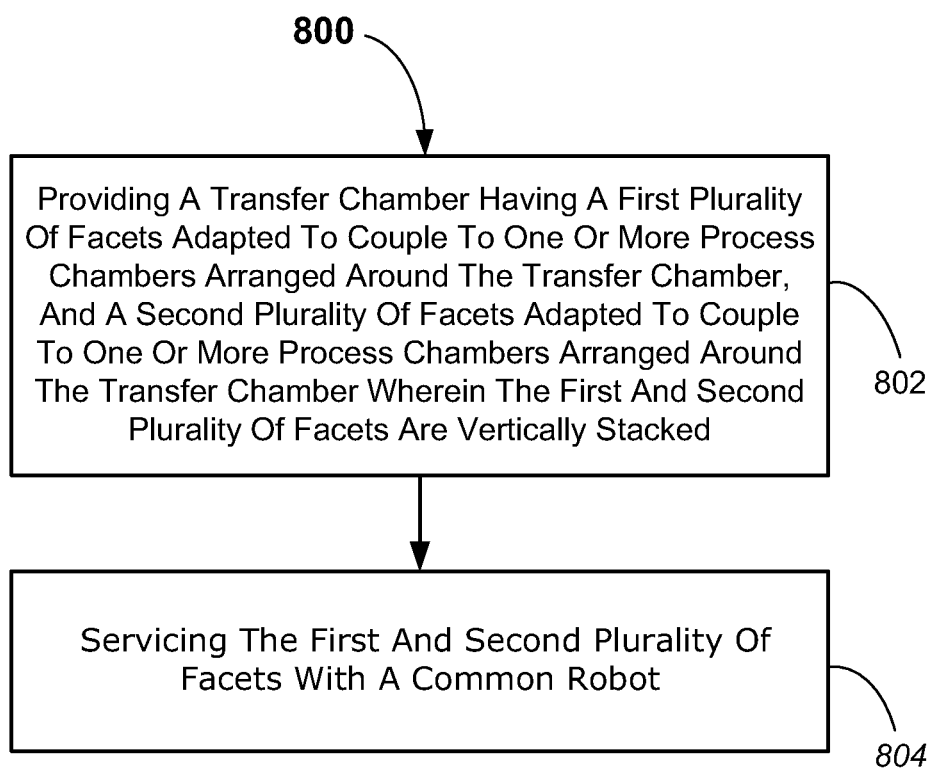
FIG. 8 illustrates a flowchart depicting a method of transporting a substrate within an electronic device processing system according to embodiments.

A method 800 of transporting a substrate within an electronic device processing system (e.g., electronic device processing system 100) according to embodiments of the present invention is provided and described with reference to FIG. 8. The method 800 includes, in 802, providing a transfer chamber (e.g., transfer chamber 102) having a first plurality of facets adapted to couple to one or more process chambers (e.g., one or more process chambers 106L) arranged around the transfer chamber, and a second plurality of facets adapted to couple to one or more process chambers (e.g., one or more process chambers 106U) arranged around the transfer chamber wherein the first and second plurality of facets are vertically stacked. In 804, the first and second plurality of facets are serviced with a common robot (e.g., robot 104). In particular, the common robot (e.g., robot 104) includes suitable Z-axis capability so that both elevations may be reached by an end effector of the robot. The upper elevation may include the same number of process chambers as the lower elevation, or a lesser number. For example, in some embodiments, only one or two process chambers 106U may be provided at the upper elevation. In some embodiments, only substrate degassing apparatus may be provided at the upper elevation so that degassing processes may be carried out on the substrates at the upper elevation. In other embodiments, the upper elevation may include one or more facets devoted to providing storage locations for substrates. The storage locations may include storage for two or more, three or more, or even four or more substrates. Indexing may be needed for over two substrates.

As should be apparent, using the electronic device processing system 100 and method 800 as described herein, one or even multiple additional process steps may be carried out within the tool, and the overall vertical footprint of the tool (including process chambers, transfer chamber, and load locks) may remain approximately the same.

Figure 9:
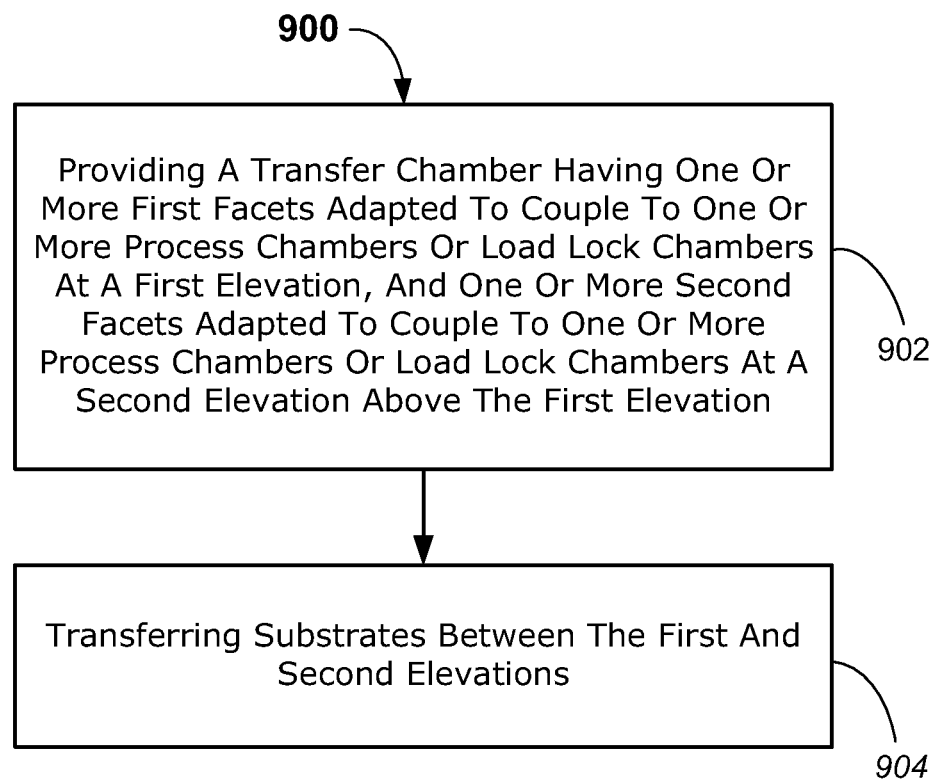
FIG. 9 illustrates a flowchart depicting a method of transporting a substrate within an electronic device processing system according to embodiments.

In another aspect, a method of transporting a substrate within an electronic device processing system is described in FIG. 9. The method 900 includes, in 902, providing a transfer chamber having one or more first facets adapted to couple to one or more process chambers (e.g., 106L) or load lock chambers (e.g., 108L) at a first elevation, and one or more second facets adapted to couple to one or more process chambers (e.g., 106U) or load lock chambers (e.g., 108L) at a second elevation above the first elevation, and, in 904, transferring substrates between the first and second elevations.

In one embodiment, the transferring is accomplished by a common robot (e.g., robot 104) operating in the transfer chamber (e.g., 102), such as is shown in FIGS. 1A-3. In another embodiment, the transferring is accomplished by an elevator apparatus (e.g., elevator apparatus 535) operating in an elevator chamber (e.g., elevator chamber 530), as is shown in FIGS. 5A-5D and 6. When an elevator apparatus is used to accomplish the transfer, a first robot (e.g., robot 504A) interfaces with the elevator apparatus at the first elevation, and a second robot (e.g., robot 504B) interfaces with the elevator apparatus (e.g., elevator apparatus 535) at the second elevation.

FIGS. 10A-10C and 11A-11C illustrate several systems utilizing two-tiered transfer chamber bodies 1003 having an elevator apparatus 1035 and upper and lower transfer chamber bodies 1003U, 1003L. Referring to FIGS. 10A-10C, a degas process (e.g., a Dual Mode Degas—DMD) is illustrated that is taking place at one or more process chambers 1006U on the second tier (second elevation) and the exchange of substrates to the factory interface 1009 is only through the load lock chamber 1008L at the lower elevation. Separate robots 1004A, 1004B service the process chambers 1006L, 1006U and/or load lock chambers 1008L (e.g., a single wafer load locks or "SWLLs") in the depicted embodiment. For example, robot 1004A services the process chambers 1006L labeled B, C, D, E, and F on the lower elevation 1003L and the two load lock chambers 1008L (e.g., SWLLs), which are both operating in both the in and out directions. Robot 1004B services the process chambers 1006U (e.g., DMD) on the upper elevation 1003U. The elevator apparatus 1035 located in chamber A functions to transfer the substrates between the robots 1004A and 1004B at the two elevations 1003L, 1003U. Optional process chambers 1006U1 and/or 1006U2 may be provided on the upper elevation 1003U to carry out other processes (e.g., additional degas processes, storage, etc.). Other numbers of additional process chambers may be included. Transfer chambers 1002L, 1002U (e.g., buffer chambers) may be separated by dividing wall 1002D.

FIGS. 11A-11C illustrate a degas process (e.g., a DMD process) taking place on the second tier (elevation) 1103U and exchange of substrates through load lock chambers 1108L, 1108U (e.g., SWLLs) located on both the lower elevation 1103L and upper elevation 1103U. Separate robots 1104A, 1104B service the process chambers 1106 and load lock chambers 1108L, 1108U (e.g., SWLL) on each elevation 1103L, 1103U. Any suitable robot may be used, such as any of the multi-link robots described herein. For example, robot 1104A services the process chambers 1106L labeled B, C, D, E, and F on the lower elevation 1103L and the two load lock chambers 1108L (e.g., SWLL), which may both be operating in only one direction as illustrated by directional arrows shown.

Robot 1104B services the process chambers 1106U (e.g., a DMD process) taking place on the upper elevation 1103U and two load lock chambers 1108U (e.g., SWLL) which may be both operating in only one direction as indicated by directional arrows. The elevator apparatus 1135 located in chamber A is configured and operational to transfer the substrates between the upper robot 1104B and the lower robot 1104A operating at each elevation 1103U, 1103L. Additional elevator apparatus may be added if needed, such as at the B location if not needed for a process chamber.

As shown, the substrate work flow is in from the factory interface 1109 through the upper load lock chambers 1108U and out through the lower load lock chambers 1108L after processing takes place at the lower elevation 1103L. Processing on the lower elevation 1103L may include chemical vapor deposition (CVD), plasma vapor deposition (PVD), cleaning or pre-cleaning, or the like. Other processes may be carried out on the lower elevation 1103L. At one or more of the upper process chambers 1106U, a degas process may take place. The degas process may heat the substrate sufficiently to remove at least some or all residual gas from the substrate prior to additional processing. A degas process (e.g., DMD process) may be the only process taking place at the upper elevation 1103U. Optionally, a storage process may also take place at the upper elevation 1103U, such as at process chamber 1106US. Although not shown, additional processes may be carried out in another sub-system attached to the lower elevation 1103L and operational at the same elevation. Transfer through to the attached sub-system may be through a pass-through chamber located at chamber B, for example. In the depicted embodiment, the two elevations 1103L, 1103U may be separated by an air gap 1139 that may be used for attaching or locating various connections, supporting equipment, conduits, lines, etc.

FIGS. 12A-12C illustrate a process, such as a degas process (e.g., a DMD process), taking place in a process chamber 1206U on the second tier (elevation) 1203U and exchange of substrates only through load lock chambers 1208L (e.g., SWLLs) located at the lower elevation 1203L. In this embodiment, a single robot 1204 is provided in the transfer chamber 1202 and is configured and operational to service the process chambers 1206L, 1206U on the lower and upper elevations 1203L, 1203U as well as load lock chambers 1208L (SWLL) on the lower elevation 1203L. Any suitable robot may be used, such as any of the multi-link robots described herein. For example, robot 1204 may service the process chambers 1206L labeled B, C, D, E, and F and the two load lock chambers 1208L (e.g., SWLL) on the lower elevation 1203L and the process chamber 1206U (e.g., degas chamber) operational on the upper elevation 1203U. Load locks chambers 1208L allow transfer of substrates between the transfer chamber 1202 and the factory interface 1209. Additional optional process chambers 1206U1, 1206U2 may be added to the upper elevation 1203U and serviced by the common robot 1204. Other process chambers may be added as well.

FIG. 13 illustrates one example embodiment of an elevator apparatus 1335 that may be used with system embodiments described herein. The elevator apparatus 1335 may include a carrier 1337 that includes one or more supports, slots, or platforms that are adapted to carry the one or more substrates between the first and second elevations. Actuation of an actuator 1336 coupled to the carrier 1337 moves the carrier 1337 vertically within the passage (e.g., passage 530) between the elevations such that end effectors of the robots (e.g., 504A, 504B, 1004A, 1004B, 1104A, 1104B) may extract substrates resting on and supported by the carrier 537. The elevator apparatus 1335 may include a base 1341 that is configured and adapted to be coupled to the chamber body (e.g., 101) such as by bolts and suitable seals (e.g., o-rings). The carrier 1337 in the depicted embodiment may include one or more supports 1337A, 1337B, 1337C. Supports 1337A, 1337B, 1337C may comprise bend beams coupled to a ring as shown. Other constructions of the carrier 1337 to carry the substrates may be used. The actuator 1336 may be any suitable type of actuator to cause the vertical motion of the substrate 105 in the passage (e.g., passage 530), such as a hydraulic, pneumatic, electrical actuator, or the like. A suitable displacement sensor or other suitable feedback device may be used to provide positional feedback concerning the vertical location of the carrier 1337.

The foregoing description discloses only example embodiments of the invention. Modifications of the above-disclosed apparatus and methods which fall within the scope of the invention will be readily apparent to those of ordinary skill in the art. Accordingly, while the present invention has been disclosed in connection with example embodiments thereof, it should be understood that other embodiments may fall within the spirit and scope of the invention, as defined by the following claims.

The invention claimed is:

1. A degassing apparatus, comprising:
   a housing including at least one entrance;
   a heated platform adapted to heat a substrate within the housing; and
   a cooling platform adapted to cool a substrate within the housing;
   a first actuator coupled to pins and adapted to carry a substrate to a location proximate to the cooling platform; and
   a second actuator adapted to lift the heated platform and a substrate proximate to a supplementary heating source.

2. The degassing apparatus of claim 1, wherein the supplementary heating source comprises at least one heat lamp.

3. The degassing apparatus of claim 1, wherein the heated platform comprises a resistance heater adapted to generate a temperature of a substrate of greater than about 100° C.

4. The degassing apparatus of claim 1, comprising a resistance heater on the heated platform and a supplementary heat source.

5. The degassing apparatus of claim 1, comprising at least two slit valves.

* * * * *